United States Patent [19]
Komoriya et al.

[11] Patent Number: 6,072,735
[45] Date of Patent: Jun. 6, 2000

[54] BUILT-IN REDUNDANCY ARCHITECTURE FOR COMPUTER MEMORIES

[75] Inventors: Goh Komoriya, Allentown; Hai Quang Pham, Hatfield, both of Pa.

[73] Assignee: Lucent Technologies, Inc., Murray Hill, N.J.

[21] Appl. No.: 09/102,499

[22] Filed: Jun. 22, 1998

[51] Int. Cl.[7] .................................................. G11C 7/00
[52] U.S. Cl. ................ 365/200; 365/230.03; 365/230.06
[58] Field of Search ..................................... 365/200, 201

[56] References Cited

U.S. PATENT DOCUMENTS

| | | | |
|---|---|---|---|
| 4,241,425 | 12/1980 | Cenker et al. | |
| 4,541,078 | 9/1985 | Dumbri et al. | |
| 4,599,709 | 7/1986 | Clemons. | |
| 5,021,944 | 6/1991 | Sasaki et al. | 365/200 |
| 5,262,994 | 11/1993 | McClure | 365/200 |
| 5,297,094 | 3/1994 | Rastegan | 365/210 |
| 5,347,484 | 9/1994 | Kwong et al. | 365/49 |
| 5,513,136 | 4/1996 | Fandrich et al. | 365/188.04 |
| 5,519,657 | 5/1996 | Arimoto | 365/200 |
| 5,544,113 | 8/1996 | Kirihata et al. | 365/200 |
| 5,574,688 | 11/1996 | McClure et al. | |
| 5,608,678 | 3/1997 | Lysinger | 365/200 |
| 5,761,138 | 6/1998 | Lee et al. | 365/200 |
| 5,774,396 | 6/1998 | Lee et al. | 365/185.09 |
| 5,790,462 | 8/1998 | McClure | 365/200 |
| 5,793,683 | 8/1998 | Evans | 365/200 |
| 5,822,257 | 10/1998 | Ogawa | 365/200 |
| 5,930,169 | 7/1999 | Iwata et al. | 365/185.09 |
| 5,933,377 | 8/1999 | Hidaka | 365/200 |
| 5,966,333 | 10/1999 | Otani et al. | 365/200 |
| 5,970,002 | 10/1999 | Yoo | 365/200 |

FOREIGN PATENT DOCUMENTS

| | | |
|---|---|---|
| 402294999A | 12/1990 | Japan. |
| 407192491A | 7/1995 | Japan. |

OTHER PUBLICATIONS

Maurice J. Marongiu and Randy Clarksean, Thermal Management of Outdoor Enclosures Using Phase Change Materials, Electronics Cooling, Jan. 1998, vol. 4, No. 1.

*Primary Examiner*—Viet Q. Nguyen
*Attorney, Agent, or Firm*—Duane, Morris & Heckscher LLP

[57] ABSTRACT

A computer main memory is divided into multiple physically-separated arrays of memory cells. Each array has associated with it an array of spare memory cells. The array of spare memory cells is located adjacent to its associated main memory cell array. The rows in the spare memory cell array are aligned with the rows in the associated main memory cell array. The main memory blocks are divided into subblocks. Within each subblock, all columns are addressed by a single multiplexer unique to that subblock. A data input bus and a data output bus is provided corresponding to each subblock in the main memory block. Each data input bus and data output bus is electrically coupled to a main memory bus, and each spare memory block. Data can therefore be readily directed either to one of the subblocks in the main memory or to one of the spare memory blocks.

3 Claims, 4 Drawing Sheets

BUILT-IN REDUNDANCY ARCHITECTURE FOR COMPUTER MEMORIES

FIELD OF THE INVENTION

This invention relates to architectures for computer memories, and in particular to the architecture of computer memories provided with a main memory and a spare memory.

BACKGROUND OF THE INVENTION

Computer memories, such as static random access memories (SRAMs), include large arrays of physical memory cells. In the manufacture of chips bearing large arrays of physical memory cells, a very large percentage, if not all, of the chips will have a defect in at least one of the memory cells. A defect in at least one of the cells is unacceptable. In the past, for SRAMs, it has been impractical to discard all but those chips that contain no defective cells. In DRAMs, which are generally much larger arrays, discarding all chips with defects results in unacceptably low yields. As a result, memories are manufactured with both a main memory and a spare memory. The spare memory is specifically provided to replace defective memory cells in the main memory.

In a conventional memory, all of the cells on a single chip are disposed in a single block memory array. Devices for accessing the cells are arranged on two sides of the block memory array. For example, FIG. 1 depicts a prior art memory 10 including block memory array 12. Memory 10 may be a 64K memory having 512 rows by 128 columns of cells. The rows are selected by block row decoders 14, physically located on one side of block memory array 12, adjacent the ends of the row lines. Each row line is electrically connected to block row decoders so that appropriate signals can be received and transmitted. The columns are connected to 8 input/outputs through a series of devices. At the end of each column line, there are line precharges 16, corresponding in size, in bits, to the number of columns. Physically adjacent line precharges 16, and appropriately electrically connected, are read/write multiplexers 18. In the example of FIG. 1, with a block memory array 12 having 128 columns, there are eight 16-channel read/write multiplexers 18. Adjacent read/write multiplexers 18 are column decoders 19 and read/write circuits 20, which are electrically connected to input/outputs (not shown). Block controls 22 are located along an edge of the line precharges, the multiplexers, and the column decoders and read/write circuits, and along an edge of the block row decoders, to provide appropriate controls.

Conventionally, when a bad cell is detected, physical connections are laser burned for the row and column lines from the bad cell to a cell in a spare memory block.

In an application filed simultaneously herewith, a method and system have been developed for avoiding the need for creating physical connections. Rather, a look up table is maintained with the address of each bad cell, and a corresponding address of the corresponding cell in the spare memory block.

SUMMARY OF THE INVENTION

In one aspect of the invention, there is provided a computer memory having a selected number of main memory cells, which memory cells are located on a single substrate but in a plurality of physically separated arrays. Each array has associated with it an array of spare memory cells. The array of spare memory cells is located adjacent to its associated main memory cell array. In particular, the rows in the spare memory cell array are aligned with the rows in the associated main memory cell array. The main memory blocks are divided into subblocks. Within each subblock, all columns are addressed by a single multiplexer unique to that subblock.

In another aspect of the invention, a computer memory has one or more main memory blocks and a spare memory block corresponding to each main memory block. Each main memory block has a main memory input/output bus coupled to the main memory block. A data input bus and a data output bus is provided corresponding to each subblock in the main memory block. Each data input bus and data output bus is electrically coupled to a main memory bus, and each spare memory block. Data can therefore be readily directed either to one of the subblocks in the main memory or to one of the spare memory blocks.

DETAILED DESCRIPTION OF A PREFERRED EMBODIMENT

Figure 2:
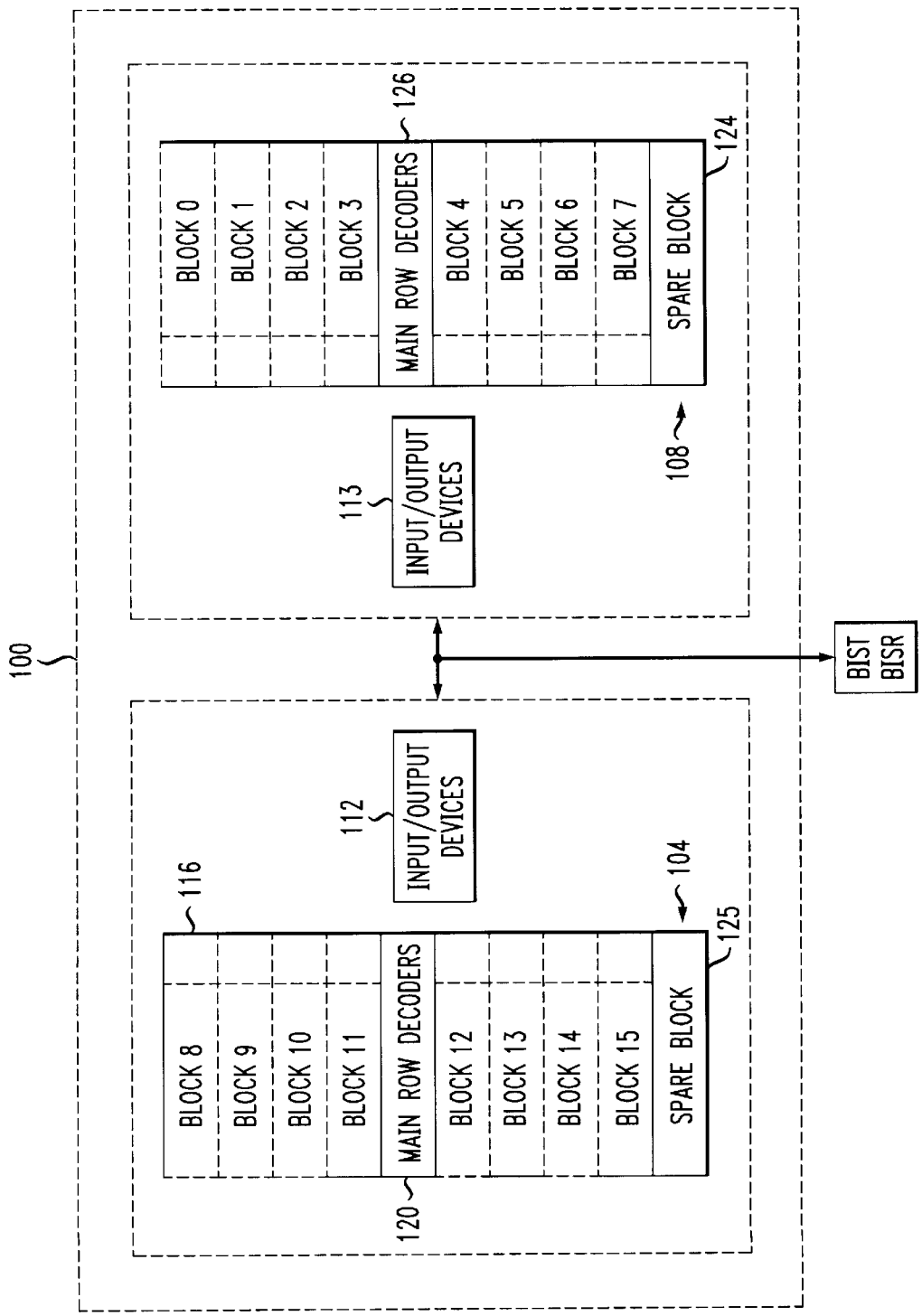
FIG. 2 is a partially schematic diagram of a memory block according to the invention.

Referring now to FIG. 2, there is shown a partially schematic view of the architecture of a computer memory 100 in accordance with the invention. Computer memory 100 may be an embedded memory, i.e., a memory that is supplied with other devices, such as logic devices or circuits other than memory circuits. Memory 100 is disposed on a substrate of conventional materials, such as silicon. It will be understood that memory 100 includes a large number of memory cells, each of which is defined by the intersection of a row and column. Memory 100 is not disposed in a single array of cells but is divided into multiple subarrays 104 and 108. Subarray 104 has associated with it input/output devices generally indicated by block 117. Similarly, subarray 108 has associated there with input/output devices generally indicated by block 113. Input/output devices at blocks 112, 113 are coupled to address decoder block, input data latches, and output buffers, in a conventional manner, as well as to built-in self-test and built-in self-repair circuits on the substrate. Subarray 104 is further divided into multiple blocks, and in particular, eight blocks 116, indicated as Block 8 through Block 15 in FIG. 2. Each block has the same number of rows and columns. A single block of main row decoders 120 is provided physically along the ends of rows and intermediate two of blocks 116, and in particular intermediate Block 11 and Block 12. Main row decoders 120 are adapted to provide row signals in accordance with well-known techniques.

Subarray 108 has defined at one end thereof spare block 124. Spare block 124 includes one or more spare arrays, and associated controls, as described in more detail below. Spare block 124 and blocks 118 are arranged in a substantially continuous array. The array is not entirely continuous, as main row decoders 126 are disposed among blocks 118. In addition, controls in spare block 124 are disposed intermediate the spare array and blocks 118.

Figure 3:
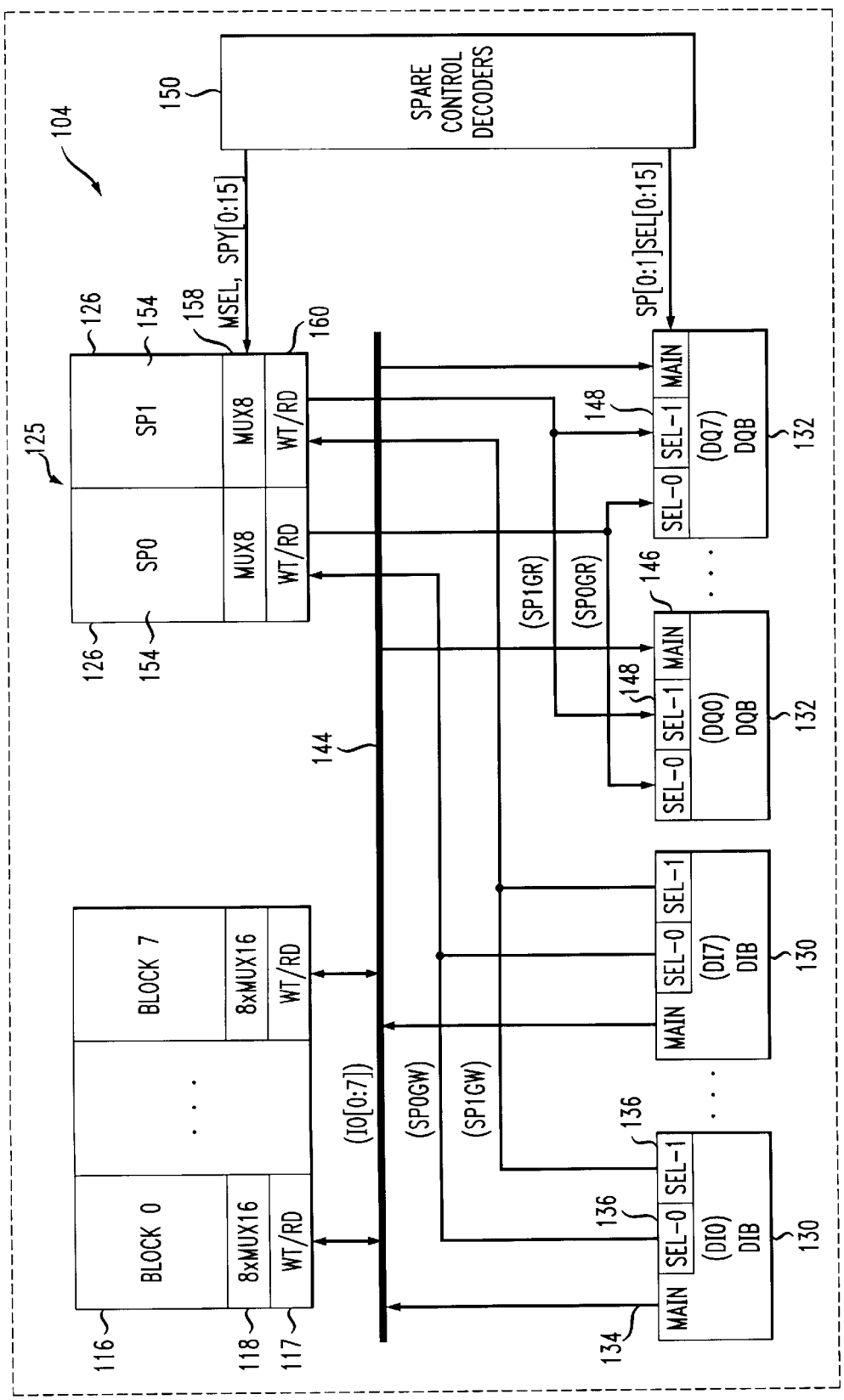
FIG. 3 is a partially schematic diagram of one-half of a memory block of FIG. 2.

Referring now to FIG. 3, there is shown the architecture of subarray 104 in more detail. As is conventional in memory architectures, there are a series of data input busses 130 and a series of data output busses 132. As is conventional, busses 130 and 132 are coupled through data lines to devices external to memory 100. In a one megabyte SRAM, there may be eight of each bus, each one corresponding to one of the main memory blocks 116. Each data input bus 130 has a main output 134 and one output 136 corresponding to each spare block. In the illustrated embodiment, there are two spare blocks 140, 142. Each main output 134 is coupled to main input/output bus 144. Main input/output bus 144 is in turn coupled to each of main blocks 116. Each main block 116 includes a write/read circuit 117 and multiplexers 118, as is conventional. In a megabyte SRAM, each main block 116 may have a 64 Kb capacity.

Data output busses 132 each have a main input 146 and spare inputs 148 corresponding to each spare block. In the embodiment illustrated in FIG. 4, there are two spare inputs 148. Each main input 146 is coupled to main input/output bus 144. Each spare input 148 is coupled to one of the spare blocks.

Each input bus 130 and each output bus 132 is coupled to a receive a spare control signal from a spare control decoder 150. The spare control signal identifies whether or not the main output or input or one of the spare outputs or inputs is to be enabled. The spare control signal also indicates which internal data bus is to be used, which subarray of the spare array, and which column in the spare array are to be addressed.

Figure 4:
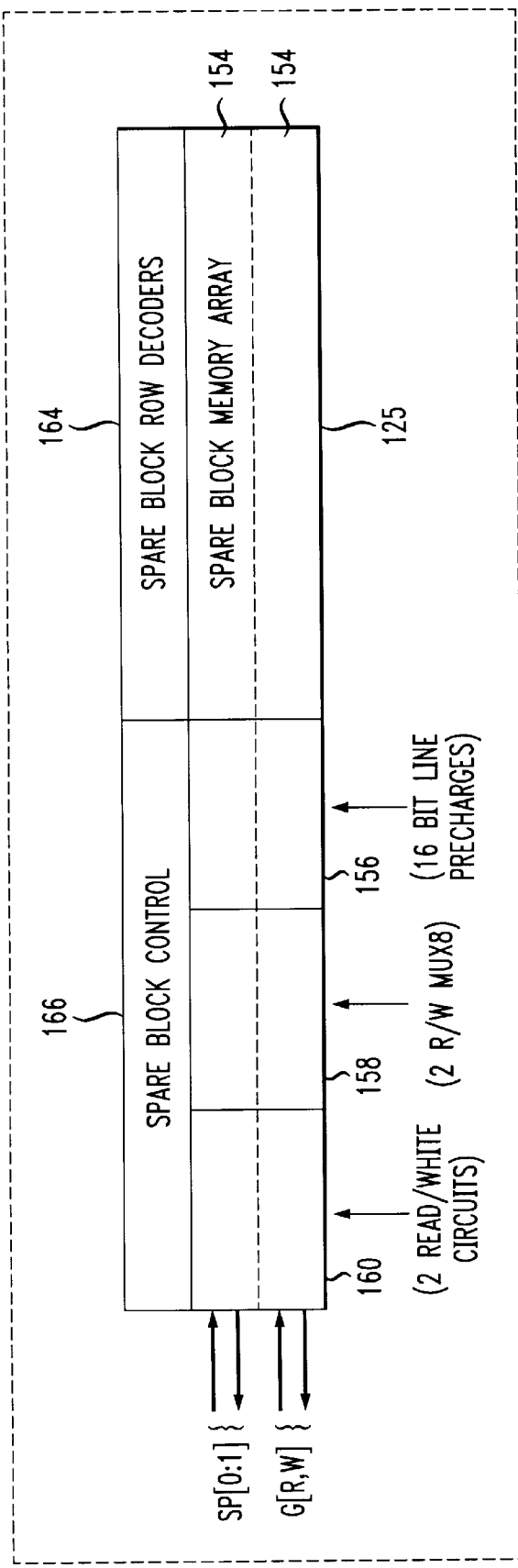
FIG. 4 is a partially schematic diagram of a spare block in a memory block of FIGS. 2 and 3.
Figure 1:
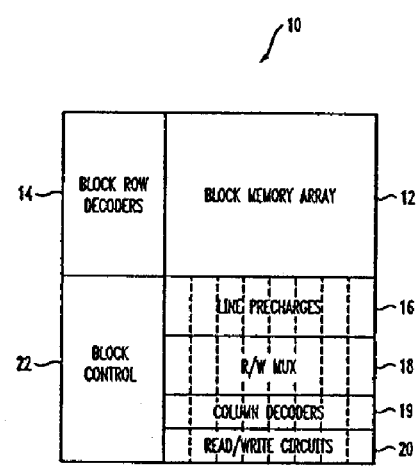

Referring now to FIG. 4, there is shown a schematic diagram of the architecture of a spare memory block according to the invention. Spare memory block 125 has two blocks 126, each of which includes a spare block memory array 154, line precharges 156 coupled to the spare block memory array; a read/write multiplexer 158, and a read/write circuit 160. Line precharges 156, read/write multiplexer 158, and read/write circuit 160 are controlled by spare block control 162. Details of the foregoing components are well-known in the art. The memory arrays are arranged in column, or bit lines, intersected by row, or word lines. Spare block row decoders 164 and spare block controls 166 are provided in a conventional manner for row decoders and block controls in SRAM memory arrays.

Numerous advantages are obtained by the foregoing architecture. As the spare blocks are physically associated with the main memory blocks, there are no delays in access time to the spare blocks. By using the same input/output busses, duplication of devices to accommodate both spare and main memory blocks is minimized. By splitting the main memory into multiple separate blocks, spare blocks can more readily be located physically adjacent a corresponding portion of the main memory block, thereby eliminating delays in access time.

While a method and apparatus of the claimed invention have been described with respect to a preferred embodiments, variations within the spirit of the invention will be readily apparent to those of skill in the art.

What is claimed is:

1. A computer memory block on a substrate, comprising:

first and second main memory blocks, each of said main memory blocks comprising a plurality of sub main memory blocks, each sub main memory block comprising a plurality of columns of memory cells, each of said columns in each of said sub main memory blocks being addressed by a single multiplexer unique to said sub main memory block, said columns in said first main memory block being parallel to one another and arranged in substantially continuous array, said columns in said second main memory block being parallel to one another and arranged in a substantially continuous array, said first main memory block having associated therewith a first spare memory block, said first spare memory block comprising a plurality of columns of memory cells, each of said first spare memory block columns being parallel to said columns of said first main memory block and arranged to define a substantially continuous array of columns comprising said columns of said first main memory block and said columns of said first spare memory block, said first spare memory block further comprising spare row decoders adjacent said spare block rows, and said second main memory block having associated therewith a second spare memory block, said second spare memory block comprising a plurality of columns of memory cells, each of said second spare memory block columns being parallel to said columns of said second main memory block and arranged to define a substantially continuous array of columns comprising said columns of said second main memory block and said columns of said second spare memory block, said second spare memory block further comprising spare row decoders adjacent said spare block rows.

2. The apparatus of claim 1, wherein each of said sub-blocks has the same number of columns.

3. The apparatus of claim 1, further comprising row decoders for the cells in said first main memory block located in said substantially continuous array of columns in said first main memory block.

* * * * *

UNITED STATES PATENT AND TRADEMARK OFFICE
CERTIFICATE OF CORRECTION

Figure 1:
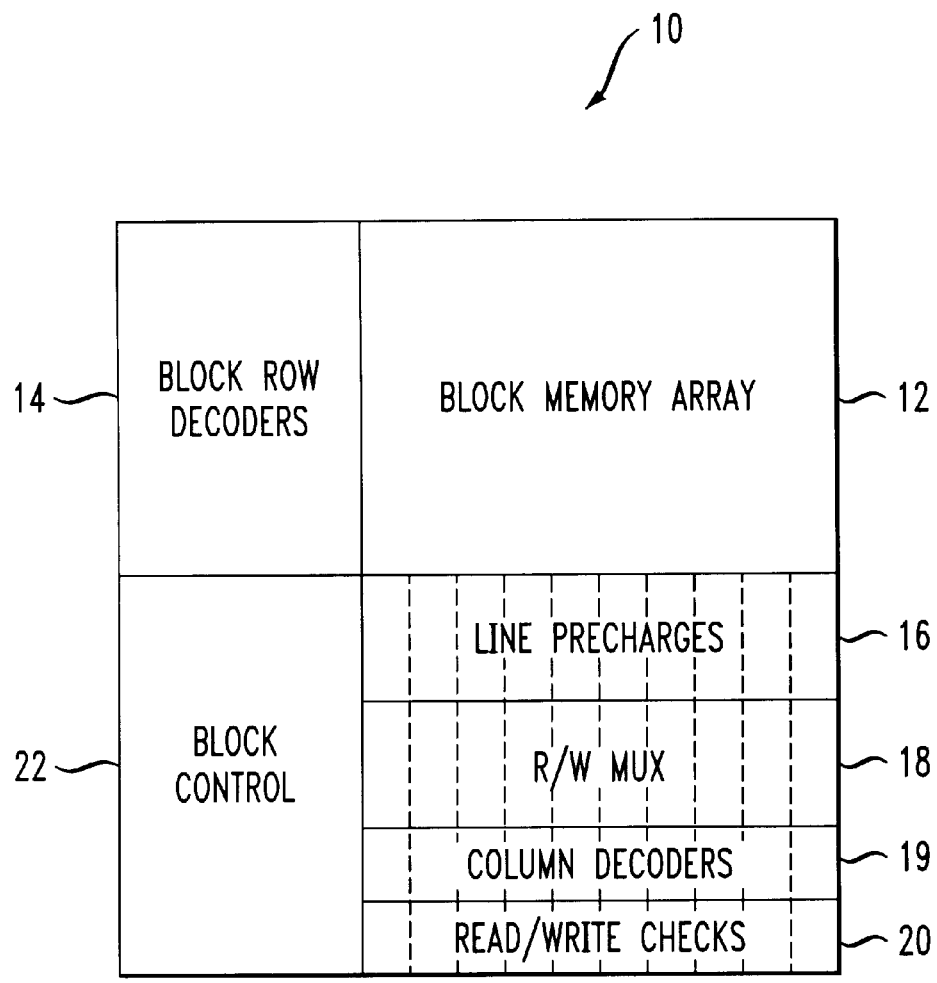
FIG. 1 is a partially schematic diagram of an exemplary prior art memory.

PATENT NO.     : 6,072,735
DATED          : June 6, 2000
INVENTOR(S)    : Goh Komoriya and Hai Quang Pham It is certified that error appears in the above-identified patent and that said Letters Patent is hereby corrected as shown below:

Drawings,
Sheet 1, delete "Figure 1 in its entirety" and insert therefor the drawing on the following page:

Signed and Sealed this

Sixth Day of August, 2002

*Attest:*

*Attesting Officer*

JAMES E. ROGAN
*Director of the United States Patent and Trademark Office*